United States Patent
Lai

[11] Patent Number: 5,960,092
[45] Date of Patent: Sep. 28, 1999

[54] SOUND PROCESSING APPARATUS AND METHOD WITH FADING EFFECT

[75] Inventor: Jason Lai, Hsinchu Hsien, Taiwan

[73] Assignee: Winbond ELectronics Corp., Hsinchu, Taiwan

[21] Appl. No.: 08/778,347

[22] Filed: Jan. 3, 1997

[51] Int. Cl.$^6$ .................................................... H03G 3/00
[52] U.S. Cl. ............................................... 381/104; 369/3
[58] Field of Search .................................. 381/61, 104, 2, 381/94.1, 106; 369/3

[56] References Cited

U.S. PATENT DOCUMENTS 4,409,682 10/1983 Mori et al. ............................. 381/104

Primary Examiner—Vivian Chang
Attorney, Agent, or Firm—Bacon & Thomas PLLC

[57] ABSTRACT

A sound processing apparatus and method with fading effect is disclosed. The sound processing method includes: sequentially sending out pulse modulation signals; separating the pulse modulation signals into a first portion and a second portion, wherein the first portion and the second portion are respectively processed by a corresponding digital to analog (D/A) conversion via a first D/A converter and a second D/A converter; respectively inputting a first reference signal and a second reference signal to the first D/A converter and the second D/A converter, thus respectively obtaining an offset signal and a fading signal from the first D/A converter and the second D/A converter; and adding the offset signal and the fading signal into an output sound signal. The sound processing apparatus includes a first reference signal generator for generating two different reference signals; a switching element for selecting one of the two different reference signals as a first reference signal; an offset effect converter for receiving a first portion of a pulse code modulation signal and the first reference signal and outputting an offset signal; a second reference signal generator for generating a second reference signal which is selected from one of two different reference signals; and a fading effect converter for receiving a second portion of a pulse code modulation signal and the first reference signal and outputting a fading signal; wherein the offset signal and the fading signal are added to be an output sound signal.

16 Claims, 6 Drawing Sheets

SOUND PROCESSING APPARATUS AND METHOD WITH FADING EFFECT

BACKGROUND OF THE INVENTION

The present invention relates to a sound processing apparatus and method with fading effect, particularly to one which only needs to separate a pulse code modulation signal into two or more sections and then proceeds conversions including at least a DC bias conversion and a fading-out conversion, thereafter combining the two converted signals to achieve a fading effect to a sound and retaining the DC level of the sound so as to eliminate distortion caused by unwanted saturation or cut-off of transistors.

Integrated circuits used in the field of synthesization of sound have been very popular for years. For generating different sound effects, different kinds of devices such as sound generators, beat generators, dual-sound generators have been provided. A conventional method utilizes a fade-in or fade-out step, i.e., to gradually increase or decrease the sound volume, for achieving sound source moving effect, i.e., for achieving stereoscopic or surround sound effects. For gradually varying the sound volume in the field of digital sound synthesization, floating point operation is applied on the sound signals.

Hereunder are formulas for achieving fade-out effect. FIG. 2 provides an explanation of these formulas. Referring to FIG. 2, PCMth represents a transition threshold of a PCM signal, i.e., the DC level of the PCM signal.

If PCM>PCMth (for example PCM1)

$$\text{PCM (fading)} = \text{PCMth} + (\text{PCM} - \text{PCMth}) * r \quad (1)$$

If PCM<PCMth (for example PCM2)

$$\text{PCM (fading)} = \text{PCMth} - (\text{PCMth} - \text{PCM}) * r \quad (1)$$

where PCM represents any point of the PCM signal of FIG. 2; and where r is a fading factor which is in the range between 0 and 1, i.e. $0 < r \leq 1$ Since the above two formulas apply multiplication of floating point (please note that the fading factor r is ranged between 0 and 1), a mathematics numeric operation unit is required thus resulting in a complicated structure and high cost.

Conventionally, the mathematics numeric operation unit is not used but is replaced with a digital/analog converter whose output signal is decreased or increased internally. Although this way can reduce cost, it suffers from distortion problems such as unwanted saturation or cut-off of transistors. For example, a transistor 41 as shown in FIG. 4 is apt to be rendered in a saturation status or cut-off status if the DC component of the input signal I/P is increased or decreased over a threshold value. More particularly, if the signal level of the input signal I/P is increased, the DC component thereof is apt to exceed a first threshold level (see MAX of FIG. 2) thus rendering the transistor 41 into a saturation status and resulting in a saturation distortion. If the signal level of the input signal I/P is decreased, the DC component thereof is apt to be less than a second threshold level (see min of FIG. 2) thus rendering the transistor 41 into a cut-off status and resulting in a cut-off distortion.

Based on the above consideration, it is requisite to provide a new device for achieving fading effect without using a floating point operation device or resulting in distortion due to unwanted saturation or cut-off of transistors.

SUMMARY OF THE INVENTION

An objective of the present invention is to provide a sound processing apparatus and method with fading effect so as to achieve a fading effect from a transistor amplifier without distortions caused by unwanted saturation or cut-off from the transistor amplifier.

In accordance with one aspect of the present invention, there is provided a sound processing method comprising a step for sequentially sending out pulse modulation signals; a step for separating the pulse modulation signals into a first portion and a second portion, wherein the first portion and the second portion are respectively processed by a corresponding digital to analog (D/A) conversion via a first digital to analog (D/A) converter and a second digital to analog (D/A) converter; a step for respectively inputting a first reference signal and a second reference signal to the first D/A converter and the second D/A converter, thus respectively obtaining an offset signal and a fading signal from the first D/A converter and the second D/A converter; and a step for adding the offset signal and the fading signal into an output sound signal.

In accordance with another aspect of the present invention, there is provided a sound processing device comprising a first reference signal generator for generating two different reference signals; a switching means for selecting one of the two different reference signals as a first reference signal; an offset effect converter which is a D/A converter for receiving a first portion of a pulse code modulation signal and the first reference signal and outputting an offset signal; a second reference signal generator for generating a second reference signal which is selected from one of two different reference signals; a fading effect converter which is a D/A converter for receiving a second portion of a pulse code modulation signal and the first reference signal and outputting a fading signal; wherein the offset signal and the fading signal are added to be an output sound signal.

DETAILED DESCRIPTION OF THE PREFERRED EMBODIMENTS

Figure 3:
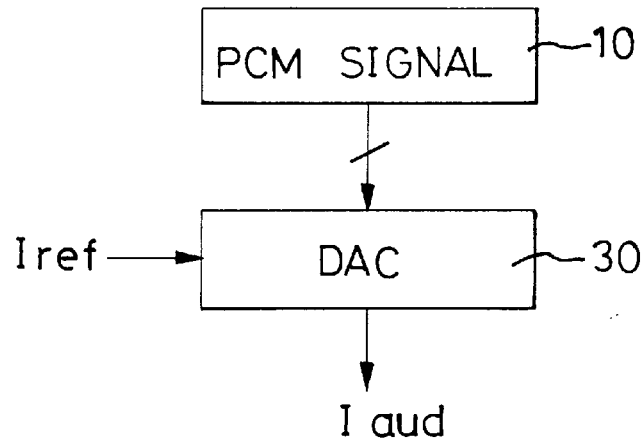
FIG. 3 is a block diagram of a conventional digital/analog converter.

Referring to FIG. 3, a conventional current-type PCM digital/analog converter 30 receives a PCM signal 10 and converts the latter to an audio signal $I_{aud}$ upon reception of a reference current $I_{ref}$. In this example, the audio signal $I_{aud}$ is equal to the PCM signal multiplied by the reference current $I_{ref}$, i.e., $I_{aud} = PCM * I_{ref}$.

Figure 2:
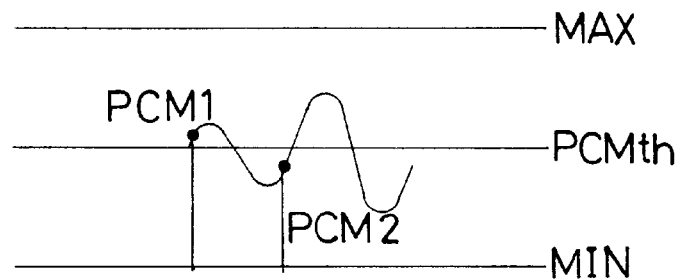
FIG. 2 is a wave form for illustrating fading effect.

The parameters as defined with reference to FIG. 2 are again used for the following formulas:

(1) If PCM≧PCMth $$I_{aud}=PCMth * I_{ref}+(PCMth-PCM) * r * I_{ref}$$

(where r is a fading factor ranged between 0 and 1, i.e., 0<r≦1)

(2) If PCM<PCMth $$I_{aud} = PCMth * I_{ref} - (PCM - PCMth) * r * I_{ref}$$
$$= PCMth*(1-r)*I_{ref} + PCM*r*I_{ref}$$

The values of the parameters Iref, r * Iref, and [(1−r) * Iref] can be obtained by means of size adjustment of components of a simple current mirror.

The first items of formulas (1) and (2) are respectively [PCMth * $I_{ref}$] and [PCMth * (1−r) * $I_{ref}$] each of which can be deemed as a transition threshold value. The second items of formulas (1) and (2) are respectively [(PCM−PCMth) * r * $I_{ref}$] and (PCM * r * $I_{ref}$) each of which can be deemed as a deviation value PCMdev.

The transition threshold value PCMth is used for generating a DC biasing current, and the deviation value PCMdev is used for generating the fading effect.

Figure 1:
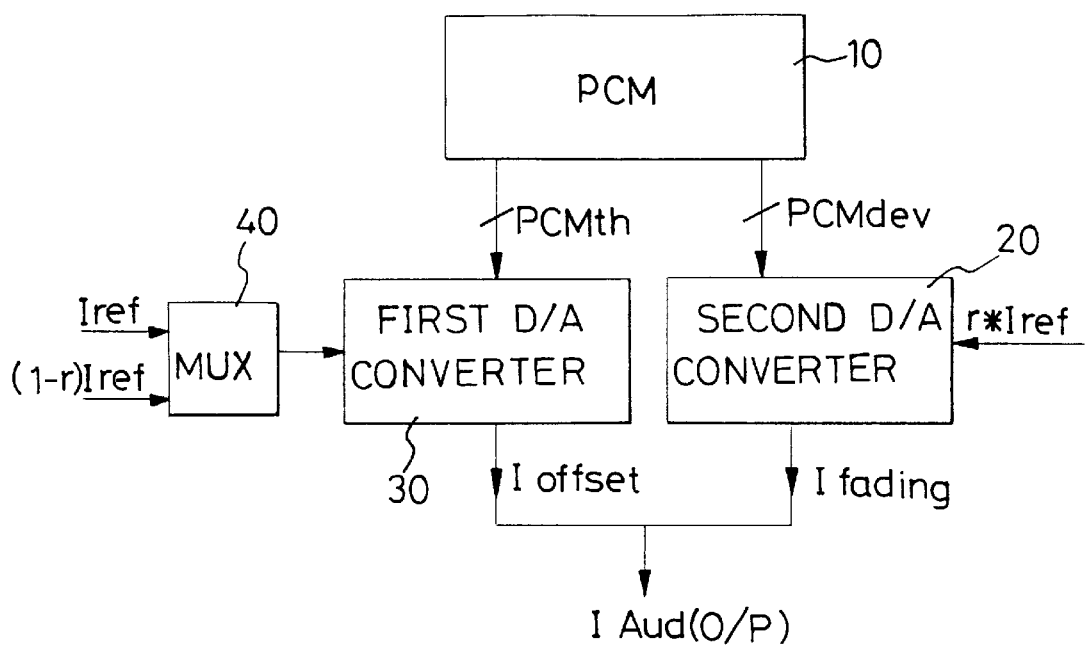
FIG. 1 is a block diagram of a sound processing apparatus with fading effect in accordance with the present invention.

Referring to FIG. 1, a pulse code modulation (PCM) signal is separated into a transition threshold value PCMth and a deviation value PCMdev each of which is respectively sent to a first D/A converter 30 and a second D/A converter 20. The first D/A converter 30 outputs an offset current $I_{offset}$ upon reception of the transition threshold value PCMth. The second D/A converter 20 outputs a fading current $I_{fading}$ upon reception of the deviation value PCMdev. An audio output current $I_{aud}$ is obtained by adding the offset current $I_{offset}$ and the fading current $I_{fading}$. The first D/A converter 30 has a reference current input terminal connected to an output terminal of a multiplexer 40 which selectively receives one of two current sources $I_{ref}$ and [(1−r) * $I_{ref}$] and sends the selected current source to the first D/A converter 30. From formulas (1) and (2), it can be appreciated that the required offset current $I_{offset}$ can be obtained by appropriately selecting one of the two current sources $I_{ref}$ and [(1−r) * $I_{ref}$] via the multiplexer 40.

The second D/A converter 20 has a reference current input terminal adapted to receive a reference current source r * $I_{ref}$. The second D/A converter 20 generates the required fading current $I_{fading}$ upon reception of the deviation value PCMdev and the reference current source (r * $I_{ref}$).

Hereunder is an example for explaining the function of FIG. 1. For example, if the PCM signal is a 8-bit signal PCM <7:0>, and the PCMth is chosen to be a middle value thereof, i.e., assuming PCMth=128, and the highest bit PCM <7> is used to be a judgment factor for either fading-in or fading-out:

(A) If PCM <7>=1 (indicating PCM≧PCMth) then: $I_{offset}$= 128 * $I_{ref}$ Since PCM−PCMth=PCM <6:0> so $I_{fading}$= PCM <6:0>* r * $I_{ref}$ (B) If PCM <7>=0 (indicating PCM<PCMth) then: $I_{offset}$= 128 * (1−r) * $I_{ref}$ Since PCM <7>=0, PCM=PCM <6:0> so $I_{fading}$=PCM <6:0>* r * $I_{ref}$ It can be resulted from (A) and (B):
$I_{fading}$=PCM <6:0>* R * $I_{ref}$
Ioffset=128 * $I_{ref}$ (when PCM <7>=1)
Ioffset=128 * (1−r) * $I_{ref}$ (when PCM <7>=0)

Figure 5:
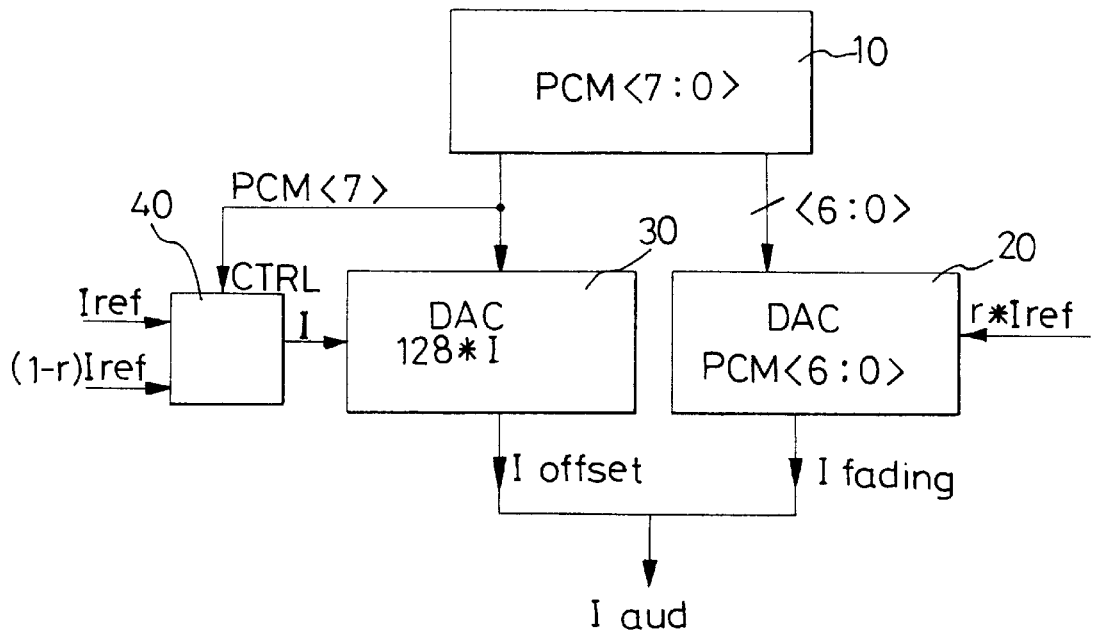
FIG. 5 is a block diagram of a sound processing apparatus of FIG. 1 in more detail.
Figure 4:
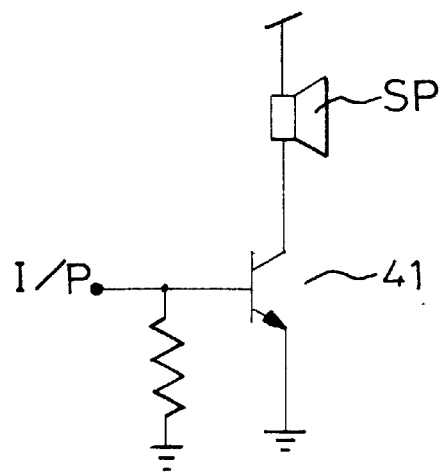
FIG. 4 is a schematic view of a conventional transistor amplifier.

The above example can be put into practice by referring to FIG. 5. A portion of the PCM signal, i.e., PCM <6:0>, are sent to the second data converter 20, which in turn generates the fading current $I_{fading}$ upon reception of the reference current r * $I_{ref}$. The highest bit PCM <7> is sent to a selection control terminal CTRL of the multiplexer 40. The multiplexer 40 selects $I_{ref}$ to the first D/A converter 30 $I_{ref}$ when the PCM <7> is in a logical high status, while it selects [(1−r) $I_{ref}$] when the PCM <7> is in a logical low status. Therefore, the first D/A converter 30 can appropriately convert the PCMth into the required offset current $I_{offset}$ which is either one of (PCMth * $I_{ref}$) and [PCMth * (1−r) * $I_{ref}$].

Figure 6:
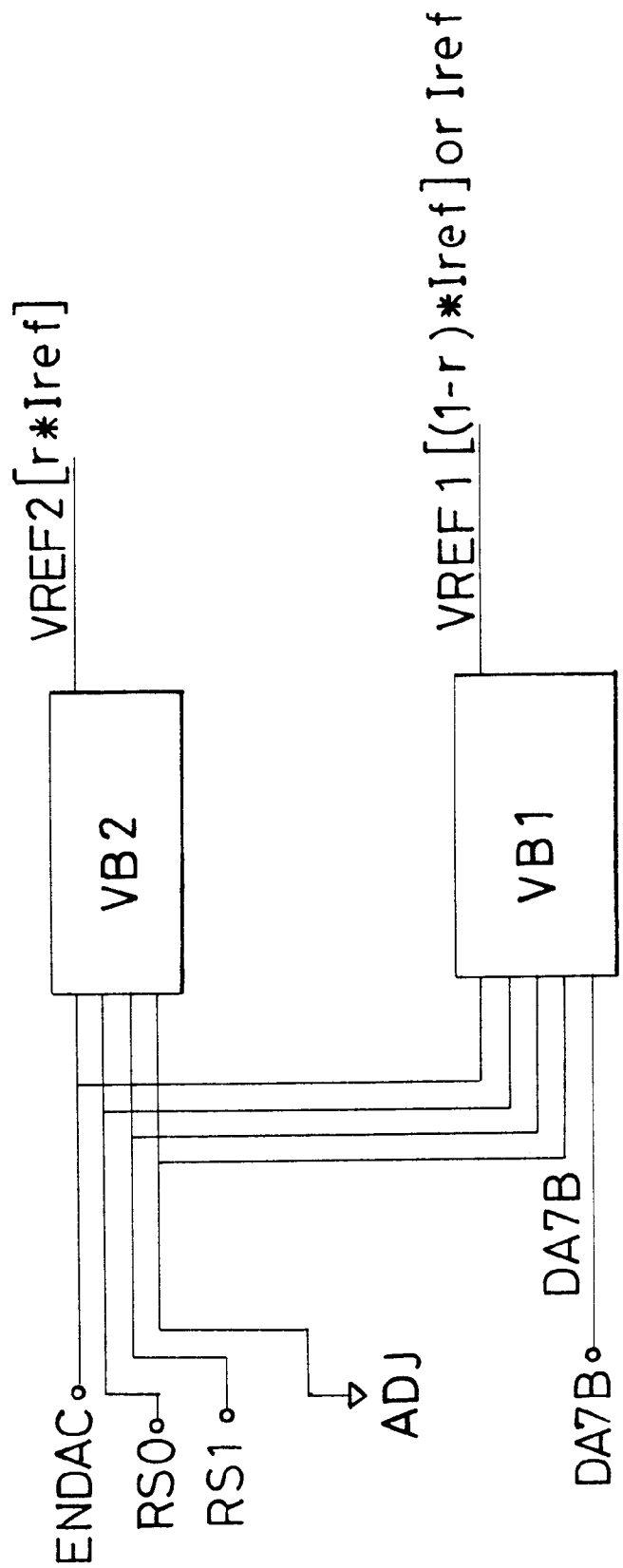
FIG. 6 is a schematic circuit of FIG. 1 in more detail
Figure 7:
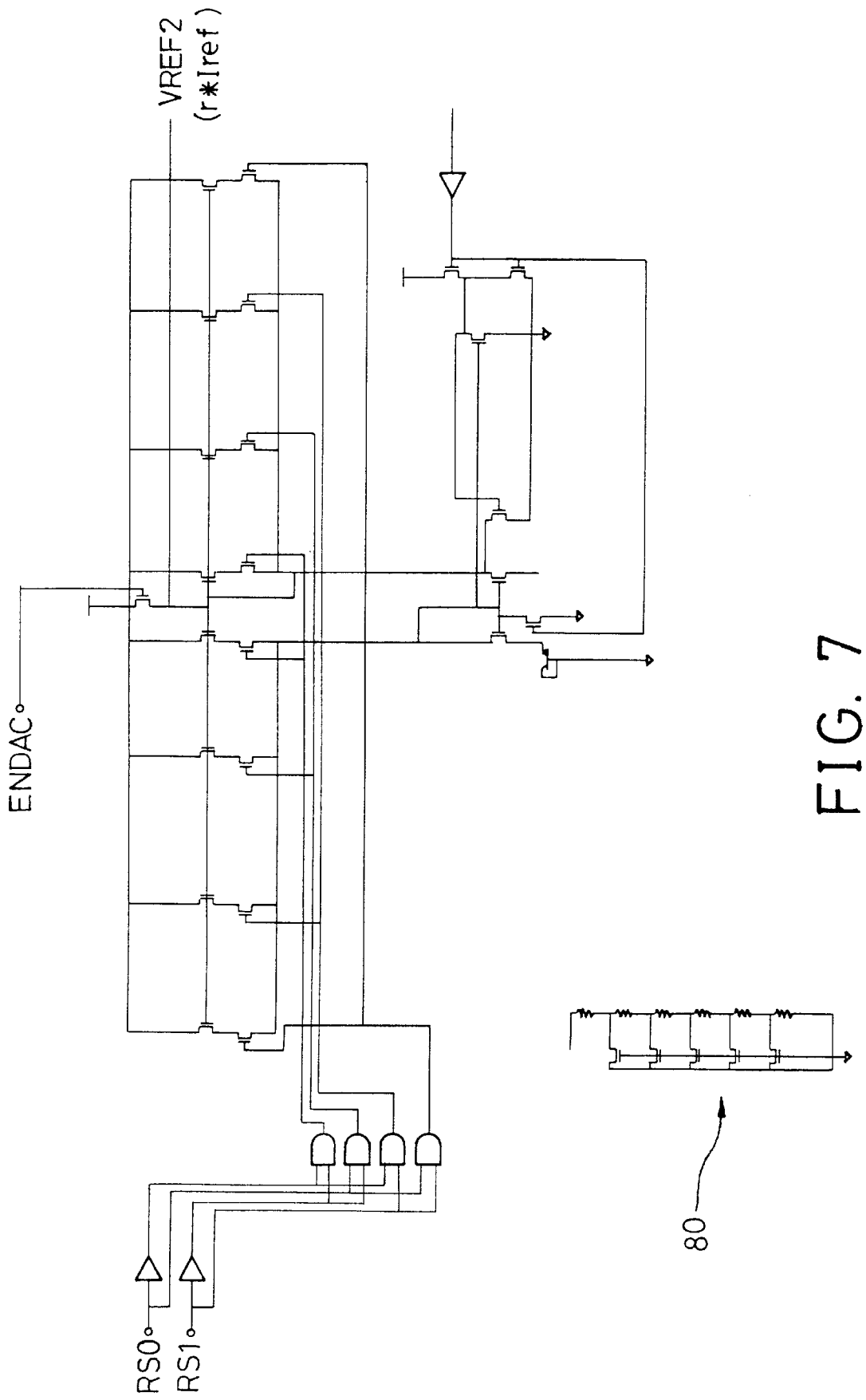
FIG. 7 is a detailed circuit of the second voltage source generator VB2 of FIG. 6.
Figure 8:
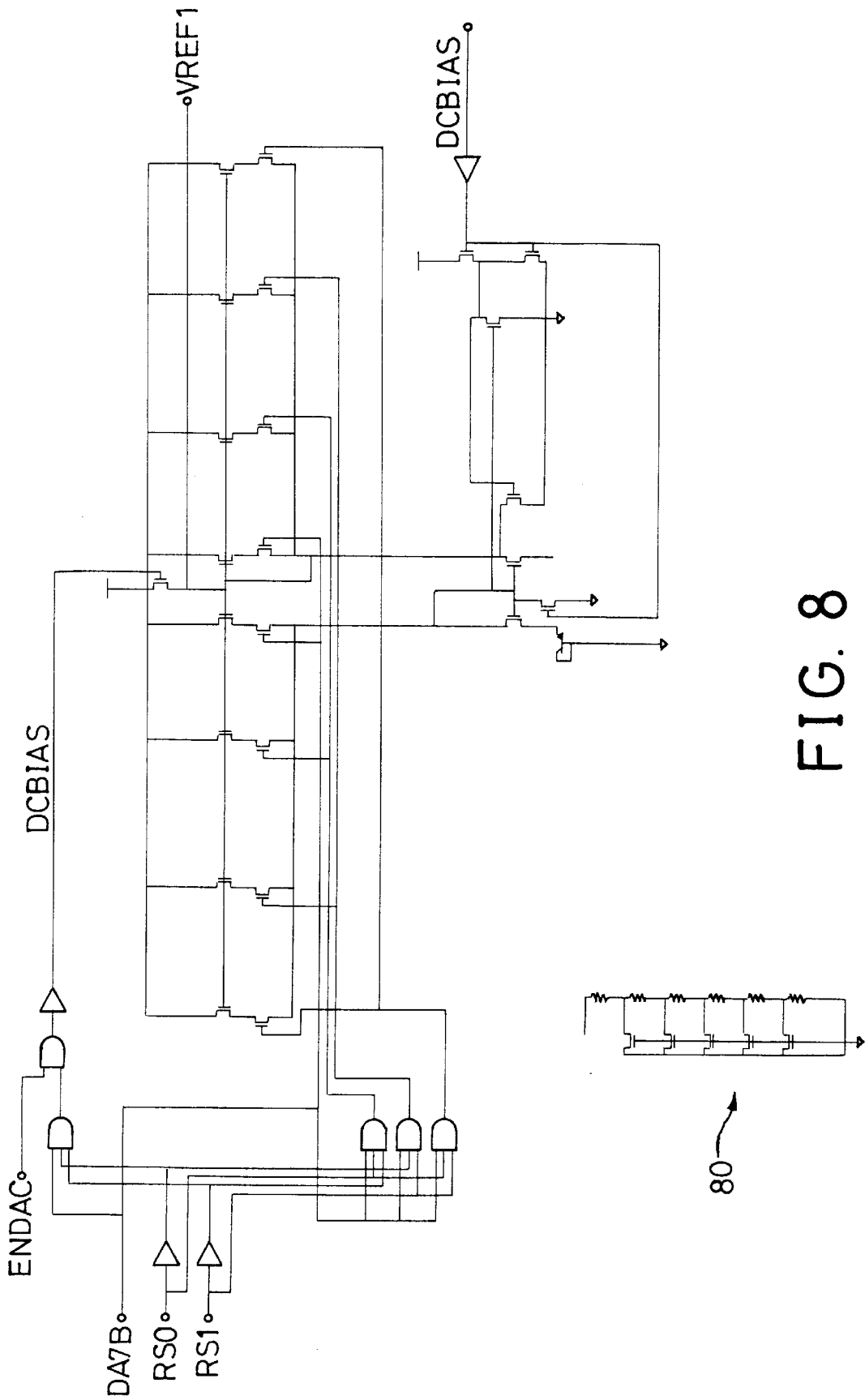
FIG. 8 is a detailed circuit of the first voltage source generator VB1 of FIG. 6.

The detailed circuit of FIG. 5 can be referred to FIGS. 6, 7 and 8. The lower half portion of FIG. 6 illustrates an 8-bit D/A converter, where DA0B, DA1B, . . . , DA6B respectively represent input terminals for bit 0, bit 1, bit 2, . . . , bit 7, and SPK as shown in the right side of the drawing represents an output terminal of the D/A converter (i.e., the output terminal of either $I_{fading}$ or $I_{offset}$ of FIG. 5). The lower seven bits (bit 0 to bit 6) of the PCM signal are used for the execution of fading function of the second D/A converter 20, while the highest bit (bit 7) is used by the first D/C converter 30. A first reference voltage generator VB1 and a second reference voltage generator VB2 respectively output a first reference voltage $V_{ref1}$ and a second reference voltage $V_{ref2}$ which respectively corresponds to the reference currents [r * $I_{ref}$] and [(1−r) * $I_{ref}$]. An enable signal ENDAC for the D/A converter, two fading factor input signals RS0 and RS1, and a reference current adjusting signal ADJ for setting the current source $I_{ref}$ are inputted into the first reference voltage generator VB1 and the second voltage generator VB2. The highest bit DA7B of the PCM signal is inputted into the second reference voltage generator VB2.

FIG. 7 is a detailed circuit of the second voltage source generator VB2 of FIG. 6. FIG. 8 is a detailed circuit of the first voltage source generator VB1 of FIG. 6. The left bottom side of FIG. 7 illustrates a reference adjustment circuit 80 which comprises a plurality of resistors and transistors for generating a reference voltage $V_{ref}$ which is corresponding to the reference current $I_{ref}$. The fading factor setting signals RS1 and RS2 are decoded into four signals for respectively driving a corresponding resistor which is composed of a transistor thus obtaining a first reference voltage $V_{ref1}$ which is corresponding to the first reference current (r * $I_{ref}$).

FIG. 8 has almost the same structure as FIG. 7, except that a control loop for controlling the second reference voltage is added. When the highest bit DA7B is in a logical high status, the second reference voltage generator VB2 generates the second reference voltage $V_{ref2}$ via the control of the control loop corresponding to the effect of reference current $I_{ref}$. When the highest bit DA7B is in a logical low status, the second reference voltage generator VB2 generates the second reference voltage $V_{ref2}$ which is corresponding to the reference current (1−r) * $I_{ref}$, via the control of the control loop.

Figure 9:
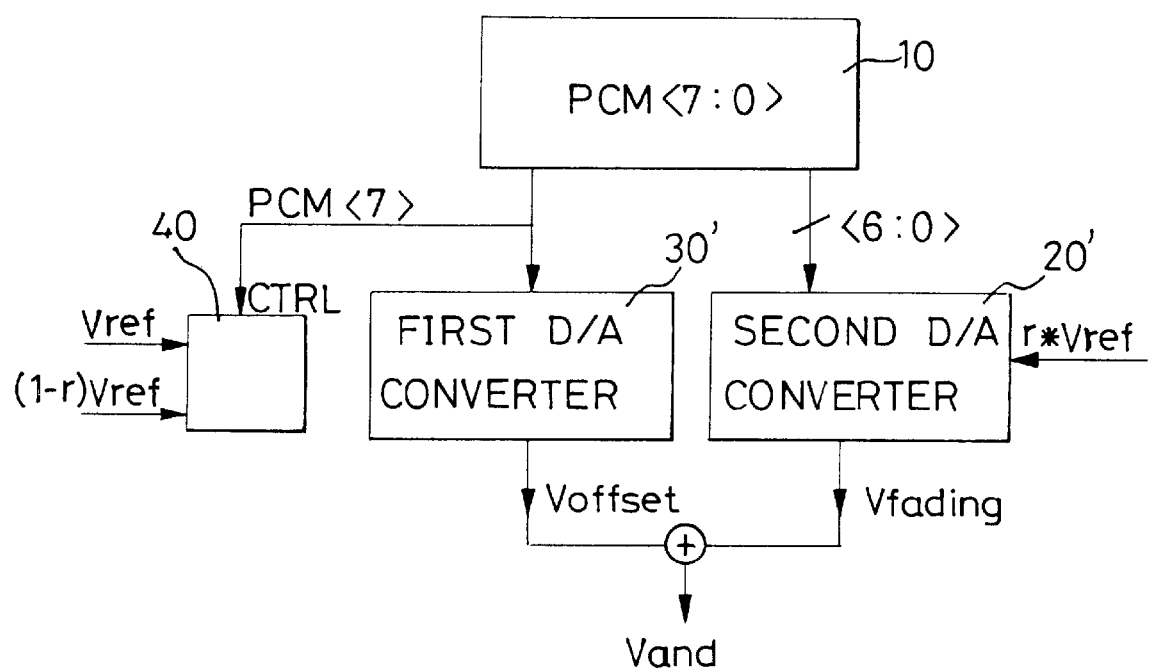
FIG. 9 is a block diagram of a sound processing apparatus using voltage-type D/A converters to replace the current-type D/A converters and further introducing an adder for obtaining the final output.

The above mentioned utilizes current-type D/A converters to achieve the effect of sound fading effect. It should be noted that, also referring to FIG. 9, a voltage-type D/A converters 30' and 20' can replace the current-type D/A converters 30 and 20 (see FIGS. 1 and 5) to achieve the fading effect merely by introducing an adder 90 to add the outputs $V_{offset}$ and $V_{fading}$ of the two votage-type D/A converters 30' and 20' and the reference currents $I_{ref1}$ and $I_{ref2}$ are respectively replaced by reference voltages $V_{ref1}$ and $V_{ref2}$.

I claim:

1. A sound processing method, comprising the steps of:
   sequentially sending out pulse modulation signals;
   separating the pulse modulation signals into a first portion and a second portion, wherein the first portion and the second portion are respectively processed by a first digital to analog (D/A) converter and a second digital to analog (D/A) converter;

respectively inputting a first reference signal and a second reference signal to the first D/A converter and the second D/A converter, said first D/A converter and said second D/A converter respectively combining said first and second reference signals with said first and second portions of the pulse modulation signals to obtain an offset signal and a fading signal from said first D/A converter and the second D/A converter; and adding the offset signal and the fading signal to obtain an output sound signal.

2. A sound processing method as claimed in claim 1 wherein the lowest bit to second highest bit of the pulse code modulation signal are input to the second D/A converter for a fading signal conversion, while the highest bit of the pulse code modulation signal is input to the first D/A converter for an offset signal conversion.

3. A sound processing method as claimed in claim 1 wherein the first reference signal is selected to be a basic reference signal when the highest bit of the pulse code modulation signal is in a first logical status, and selected to be a product of the basic reference signal and one minus a fading factor.

4. A sound processing method as claimed in claim 3 wherein the second reference signal is equal to a product of the basic reference signal and the fading factor.

5. A sound processing method as claimed in claim 3 wherein the selection of the first reference signal is by means of a multiplexer.

6. A sound processing apparatus comprising
a first reference signal generator for generating a first reference signal which is selected from one of two different reference signals;
a switching means for selecting one of the two different reference signals as a first reference signal;
an offset effect converter which is a D/A converter for receiving a first portion of a pulse code modulation signal and the first reference signal and outputting an offset signal;
a second reference signal generator for generating a second reference signal which is selected from one of the two different reference signals;
a fading effect converter which is a D/A converter for receiving a second portion of a pulse code modulation signal and the first reference signal and outputting a fading signal;
wherein the offset signal and the fading signal are added to be an output sound signal.

7. A sound processing apparatus as claimed in claim 6 wherein the first portion of the pulse code modulation signal is the highest bit of the pulse code modulation signal.

8. A sound processing apparatus as claimed in claim 6 wherein the second portion of the pulse code modulation signal includes the lowest to the second highest bits of the pulse code modulation signal.

9. A sound processing apparatus as claimed in claim 6 wherein the second reference signal is equal to a product of a fading factor and a basic reference current.

10. A sound processing apparatus as claimed in claim 6 wherein the second reference signal is equal to a product of a fading factor and a basic reference voltage.

11. A sound processing apparatus as claimed in claim 6 wherein the switching means is a multiplexer.

12. A sound processing apparatus as claimed in claim 6 wherein the switching means selects one of the two different reference signals as a first reference signal based on a logical status of the highest bit of the pulse code modulation signal.

13. A sound processing apparatus as claimed in claim 6 wherein the first signal generator and the second signal generator are current generators.

14. A sound processing apparatus as claimed in claim 13 wherein one of the two different reference signals generated by the first signal generator is a basic reference current signal and the other is the basic reference current signal multiplied by one minus a fading factor.

15. A sound processing apparatus as claimed in claim 6 wherein the first signal generator and the second signal generator are voltage generators.

16. A sound processing apparatus as claimed in claim 15 wherein one of the two different reference signals generated by the first signal generator is a basic reference voltage signal and the other is the basic reference voltage signal multiplied by one minus a fading factor.

* * * * *